United States Patent
Lee et al.

(10) Patent No.: US 7,709,377 B2
(45) Date of Patent: May 4, 2010

(54) THIN FILM INCLUDING MULTI COMPONENTS AND METHOD OF FORMING THE SAME

(75) Inventors: Jung-hyun Lee, Yongin (KR); Dae-sig Kim, Seongnam (KR); Yo-sep Min, Seoul (KR); Young-jin Cho, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

(21) Appl. No.: 11/176,657

(22) Filed: Jul. 8, 2005

(65) Prior Publication Data

US 2005/0260348 A1    Nov. 24, 2005

Related U.S. Application Data

(62) Division of application No. 10/139,252, filed on May 7, 2002, now abandoned.

(30) Foreign Application Priority Data

May 7, 2001    (KR) .................. 2001-24684
Apr. 29, 2002  (KR) .................. 2002-23297

(51) Int. Cl.
*H01L 21/469* (2006.01)
*H01L 21/4763* (2006.01)

(52) U.S. Cl. .............. 438/656; 438/239; 438/648; 438/652; 438/784; 117/89; 117/102; 427/337; 427/475

(58) Field of Classification Search ............ 427/75, 427/283, 337, 472, 475, 496
See application file for complete search history.

(56) References Cited

U.S. PATENT DOCUMENTS

| 5,082,798 A | 1/1992 | Arimoto |
| 5,972,430 A | 10/1999 | DiMeo, Jr. et al. |
| 6,060,755 A | 5/2000 | Ma et al. |
| 6,090,442 A | 7/2000 | Klaus et al. |
| 6,342,164 B1 | 1/2002 | Beuhler et al. |
| 6,492,283 B2 | 12/2002 | Raaijmakers et al. |
| 6,509,280 B2 * | 1/2003 | Choi ................... 438/778 |
| 6,576,053 B1 * | 6/2003 | Kim et al. .............. 117/89 |
| 6,747,357 B2 | 6/2004 | Lee et al. |

(Continued)

FOREIGN PATENT DOCUMENTS

GB    2 340 508    2/2000

(Continued)

*Primary Examiner*—Zandra Smith
*Assistant Examiner*—Pamela E Perkins
(74) *Attorney, Agent, or Firm*—Harness, Dickey & Pierce, P.L.C.

(57) ABSTRACT

A thin film including multi components and a method of forming the thin film are provided, wherein a method according to an embodiment of the present invention, a substrate is loaded into a reaction chamber. A unit material layer is formed on the substrate. The unit material layer may be formed of a mosaic atomic layer composed of two kinds of precursors containing components constituting the thin film. The inside of the reaction chamber is purged, and the MAL is chemically changed. The method of forming the thin film of the present invention requires fewer steps than a conventional method while retaining the advantages of the conventional method, thereby allowing a superior thin film yield in the present invention than previously obtainable.

19 Claims, 14 Drawing Sheets

U.S. PATENT DOCUMENTS

| | | | |
|---|---|---|---|
| 6,951,804 B2 * | 10/2005 | Seutter et al. | 438/618 |
| 7,141,278 B2 | 11/2006 | Koh et al. | |
| 2003/0124875 A1 | 7/2003 | Kil | |
| 2003/0190497 A1 | 10/2003 | Yang et al. | |

FOREIGN PATENT DOCUMENTS

| | | |
|---|---|---|
| JP | 2002-033320 | 1/2002 |
| JP | 2003-536272 | 12/2003 |
| KR | 2000-0013329 | 3/2000 |

* cited by examiner

THIN FILM INCLUDING MULTI COMPONENTS AND METHOD OF FORMING THE SAME

CROSS REFERENCE TO RELATED APPLICATIONS

This is a divisional application based on pending application Ser. No. 10/139,252, filed May 7, 2002 now abandoned, the entire contents of which is hereby incorporated by reference.

BACKGROUND OF THE INVENTION

1. Field of the Invention

The present invention relates to a thin film and a method of forming the same. More particularly, the present invention relates to a thin film, including multi components, composed of unit material layers which include mosaic atomic layers (MALs) composed of components constituting the thin film, and a method of forming the same.

2. Description of the Related Art

Atomic layer deposition (ALD) is a thin film deposition method which is very different from more conventional physical deposition methods such as electron beam deposition, thermal deposition, or sputter deposition. ALD is similar to chemical vapor deposition (CVD) in that chemical reactions of reaction gases are used. However, in general CVD, reaction gases are supplied at the same time and react chemically on the surface of a thin film or in the air. In ALD, different kinds of reaction gases are supplied separately by a time-sharing method, and react with the surface of a thin film. In ALD, if a different kind of reaction gas is supplied when an organic metal compound containing a metallic element (hereinafter referred to as "precursors") is adsorbed on the surface of a substrate, the reaction gas reacts with the precursors on the surface of the substrate. As a result, a thin film is formed. Thus, precursors for ALD do not decompose by themselves at a reaction temperature, and precursors adsorbed on the surface of the substrate must be very rapidly reacted with a supplied reaction gas on the surface of the substrate. ALD can obtain the best uniformity of thickness and step coverage of the thin film from the surface reaction.

In ALD, the same kinds of precursors are adsorbed on all sites of a wafer surface on which chemisorption is possible. Even if excessive precursors are supplied, physisorption of the remaining precursors is performed on the chemisorbed precursors. Here, physisorption has less cohesion force than chemisorption. The physisorbed precursors are then removed using a purge gas. Next, different kinds of precursors are supplied and chemisorbed on the chemisorbed precursors. This process is repeated to grow a thin film on the wafer surface at a predetermined speed.

For example, in ALD using precursors A and a reaction gas B, a cycle of supplying precursors A, $N_2$ (or Ar) purging, and supplying a reaction gas B is repeated to grow a thin film. The growth speed of the thin film represents the thickness of the thin film deposited in one cycle. As a result, the probability that molecules of precursors are adsorbed on any exposed surface is similar, regardless of the roughness of the exposed surface. Thus, if the supply of precursors is sufficient, a thin film having a uniform thickness is deposited at a constant speed regardless of the aspect ratio of the surface structure of the substrate. Also, depositing one layer at a time allows precise control of the thickness and composition of the thin film.

However, ALD also has the following problems. First, if a thin film containing three components or more is formed, the deposition rate in ALD is slower than the deposition rate in existing CVD. For example, if an $SrTiO_3$ layer is formed by ALD, one cycle is composed of eight steps as shown in FIG. 1. Precursors containing Sr are supplied in step 10. A purge gas is supplied to purge a reaction chamber for the first time in step 20. In step 30, a reaction gas containing oxygen is supplied to oxidize the Sr atomic layer formed in step 10. A purge gas is supplied to purge the reaction chamber for the second time in step 40. Precursors containing Ti are supplied in step 50. A purge gas is supplied to purge the reaction chamber for the third time in step 60. In step 70, a reaction gas containing oxygen is supplied to oxidize the Ti atomic layer which is formed in step 50. A purge gas is supplied to purge the reaction chamber for the fourth time in step 80. Thus, the deposition rate in ALD is much slower than the deposition rate in the existing CVD, in which components contained in precursors constituting a thin film are all supplied at the same time.

Second, it is difficult to obtain satisfactory crystal phases of unit material layers constituting a thin film, and thus a subsequent thermal treatment is required. In detail, in FIG. 2, the horizontal axis represents Kelvin temperature (K) and the vertical axis represents activity. Reference numerals G1 through G11 represent activities of $TiO_2$, $BaTiO_2$, $SrTiO_3$, $Sr_4Ti_3O_{14}$, $TiO_2S$, $SrCO_3$, $BaCO_3$, $H_2$, $CO_2$, $H_2O$, and $Sr_2TiO_4$, respectively.

Referring to FIG. 2, each phase of SrO and $TiO_2$ exists stably up to more than 600K if SrO and $TiO_2$ are alternately stacked by existing ALD to deposit an $SrTiO_3$ layer. As a result, a desired $SrTiO_3$ layer can be formed. In other words, the $SrTiO_3$ layer is only a combined state of SrO and $TiO_2$. Thus, an additional thermal treatment is required to change SrO and $TiO_2$ to a desired crystalline $SrTiO_3$. This result is commonly applied to above a ternary thin film. Therefore, the thermal treatment is required to grow an oxide layer of a separate metallic element as a compound layer when the oxide layer is stabilized.

As described above, if a thin film containing three components or more is formed by ALD, an additional thermal treatment is required to form a thin film having a desired crystal structure. Thus, the yield of the thin film process is considerably reduced.

SUMMARY OF THE INVENTION

In an effort to solve the above-described problems, it is a first feature of an embodiment of the present invention to provide a method of forming a thin film including multi components which does not require a subsequent thermal treatment for crystallization, and which has increased yield by forming the thin film at a rapid deposition rate compared to ALD, and has a crystal phase.

It is a second feature of an embodiment of the present invention to provide a thin film formed by the above-described method.

Accordingly, to provide the first feature according to one embodiment of the present invention, there is provided a method of forming a thin film including multi components. In the method, a substrate is loaded into a reaction chamber. A unit material layer, which may include a mosaic atomic layer (MAL) composed of two kinds of precursors containing components constituting a thin film, is formed on the substrate. The inside of the reaction chamber is purged, and the MAL is chemically changed.

Here, the MAL may be formed by supplying the two kinds of precursors at the same time or by a time-sharing method, preferably, the two kinds of precursors are supplied by a time sharing method after at least one kind of precursor is adsorbed on the surface of the substrate by an amount less than that sufficient for forming an atomic layer on the entire surface of the substrate, i.e., less than when being saturated.

If the precursors are supplied by a time-sharing method as described above, first precursors selected from the two kinds of precursors are supplied into the reaction chamber and then the reaction chamber is firstly purged. Then, second precursors selected from the two kinds of precursors are supplied into the reaction chamber. After initially supplying the second precursors, additional second precursors may be supplied.

Preferably, the reaction chamber is secondly purged, and third precursors selected from the two kinds of precursors are supplied into the reaction chamber. That is, one of the two kinds of precursors is resupplied. After initially supplying the third precursors, additional third precursors may be supplied. That is, one of the two kinds of precursors may be resupplied a second time. In another embodiment, the unit material layer may be a double layer, which is composed of first and second MALs, rather than a single layer. In this embodiment, preferably, the first MAL is chemically changed before supplying the second MAL on the first MAL.

More specifically, in this embodiment the first MAL is preferably formed of first and second precursors selected from the two kinds of precursors, and the second MAL is preferably formed of first and third precursors selected from the two kinds of precursors.

Alternatively, the second MAL may be formed of first and second precursors of different compositions.

The first MAL may be formed by supplying the first and second precursors at the same time or by sequentially supplying the first and second precursors by a time-sharing method.

The second MAL may be formed by supplying the first and third precursors at the same time or by sequentially supplying the first and third precursors by a time-sharing method.

To provide the first feature according to another embodiment of the present invention, there is provided a method of forming a thin film including multi components. The thin film is formed through a first step of loading a substrate into a reaction chamber and sequentially forming a mosaic atomic layer (MAL) composed of two kinds of precursors containing components constituting the thin film and forming a non-mosaic atomic layer on the MAL, to form a unit material layer constituting the thin film on the substrate, a second step of purging the inside of the reaction chamber, and a third step of chemically changing the MAL. Here, the first, second, and third steps constitute one cycle.

In the third step, the resultant material formed in the first step is preferably oxidized by a supplied oxygen source. An additional step is performed to remove by-products generated after the oxidation, namely, in this embodiment, an inert gas is made into plasma by supplying the inert gas into the chamber and applying a DC bias to the substrate. As a result, inert gaseous plasma is generated in the chamber, which is used to remove by-products from the surface of the MAL.

Here, the MAL may be formed by supplying the two kinds of precursors at the same time or by a time-sharing method. If the precursors are supplied by a time-sharing method, first precursors selected from the two kinds of precursors are supplied into the reaction chamber and then the reaction chamber is firstly purged. Then, second precursors selected from the two kinds of precursors are supplied into the reaction chamber. After initially supplying the second precursors, additional second precursors may be supplied.

Preferably, the reaction chamber is secondly purged, and third precursors selected from the two kinds of precursors are supplied into the reaction chamber. That is, one of the two kinds of precursors may be resupplied into the reaction chamber. After initially supplying the third precursors, additional third precursors may be supplied. That is, one of the two kinds of precursors may be resupplied into the reaction chamber a second time.

If the MAL is formed by the time-sharing method, each of the two kinds of precursors is preferably supplied in an amount less than that sufficient for covering the entire surface of the substrate.

In both embodiments, the MAL may be chemically changed by being oxidized, nitrified or boronized. The MAL may be oxidized by using plasma or ultraviolet-ozone using $H_2O$, $O_2$, $O_3$ or $H_2O_2$ as a source of oxygen. The plasma may be formed using radio frequency or microwave energy.

In the first embodiment, the source of oxygen may be purged using an inert gas, wherein DC-bias is applied to the substrate to make the inert gas into plasma so as to form inert gaseous plasma which is used to remove by-products adsorbed on the surface of the MAL.

In both embodiments, the thin film may be an oxide layer, a nitride layer, or a boride layer. Additionally, the thin film may be a strontium titanate (STO) layer, a lead zirconium titanate (PZT) layer, a barium strontium titanate (BST) layer, a yttrium barium cuprate (YBCO) layer, a strontium barium tantalite (SBTO) layer, a hafnium silicon oxynitride (HfSiON) layer, a zirconium silicate (ZrSiO) layer, a zirconium hafnium oxide (ZrHfO) layer, a lanthanum cobalt oxide (LaCoO) layer, or a titanium silicon nitride (TiSiN) layer.

To provide the second feature of an embodiment of the present invention, there is provided a thin film including multi components. Here, the thin film includes a plurality of unit material layers and each of the unit material layers may include an MAL composed of at least two of the components of the thin film. The unit material layers are preferably double layers (i.e., are composed of first and second MALs). The first and second MALs may be formed of the same components, where a composition ratio of the components of the first MAL is different from a composition ratio of the components of the second MAL, or the first MAL may be composed of first and second components selected from the components of the thin film and the second MAL may be composed of the first components and third components selected from the components of the thin film.

To provide the second feature according to another embodiment of the present invention, there is provided a thin film including multi components. Here, the thin film is composed of a plurality of unit material layers and each of the unit material layers is composed of an MAL, wherein each MAL is composed of two the components of the thin film, and a non-mosaic atomic layer composed of any component selected from the components of the thin film, wherein one of the two components of the MAL is different from both the other component of the MAL and the component of the non-mosaic atomic layer. The non-mosaic atomic layer may be formed on the MALs, or the MALs may be formed on the non-mosaic atomic layer.

The unit material layer is preferably a double layer. The double layer may be composed of a first MAL, composed of all of the components of the thin film, and a second MAL, composed of two components selected from the components of the thin film, or the double layer may be composed of a first MAL, composed of all of the components of the thin film, and a second MAL, composed of the same components, where a composition ratio of the components is different for each of the first and second MALs in the double layer.

The double layer may also be composed of a first MAL, composed of first and second components selected from the components of the thin film, and a second MAL formed on the first MAL, composed of first and third components selected from the components of the thin film.

In the embodiments mentioned above in which a thin film is provided, the thin film may be an oxide layer, a nitride layer or a boride layer. The thin film may also be one selected from the group consisting of an STO layer, a PZT layer, a BST layer, a YBCO layer, an SBTO layer, an HfSiON layer, a ZrSiO layer, a ZrHfO layer, a LaCoO layer, and a TiSiN layer.

To provide the second feature according to yet another embodiment of the present invention, there is provided a thin film including multi components, wherein the thin film may be one Mosaic Atomic Layer (MAL) composed of at least two different components.

In the method of forming a thin film including multi components according to the present invention, the advantages of a conventional method of forming atomic layers (ALs) may be secured, yet fewer steps are required in the process of forming ALs according to the present invention than in the conventional method. As a result, the time required for forming a thin film may be reduced. Also, since the thin film is formed and crystallized at a low temperature, an additional thermal process for the crystallization of the thin film after formation thereof is unnecessary. As a result, the yield of the method of forming a thin film of the present invention is remarkably higher than in the prior art.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Korean patent application numbers 2001-24684 and 2002-23297, filed May 7, 2001 and Apr. 29, 2002, respectively, are incorporated by reference herein in their entireties.

Hereinafter, a thin film including multi components and a method of forming the thin film according to embodiments of the present invention will be described in detail with reference to the attached drawings. Here, a substrate is regarded as being loaded into a reaction chamber. Also, the reaction chamber is not specially limited. In other words, any reaction chamber in which an atomic layer may be deposited is suitable.

A method of forming a thin film will first be described. Unit material layers of a thin film of the present invention include mosaic atomic layers (MALs), described in first and second embodiments.

First Embodiment

Figure 1:
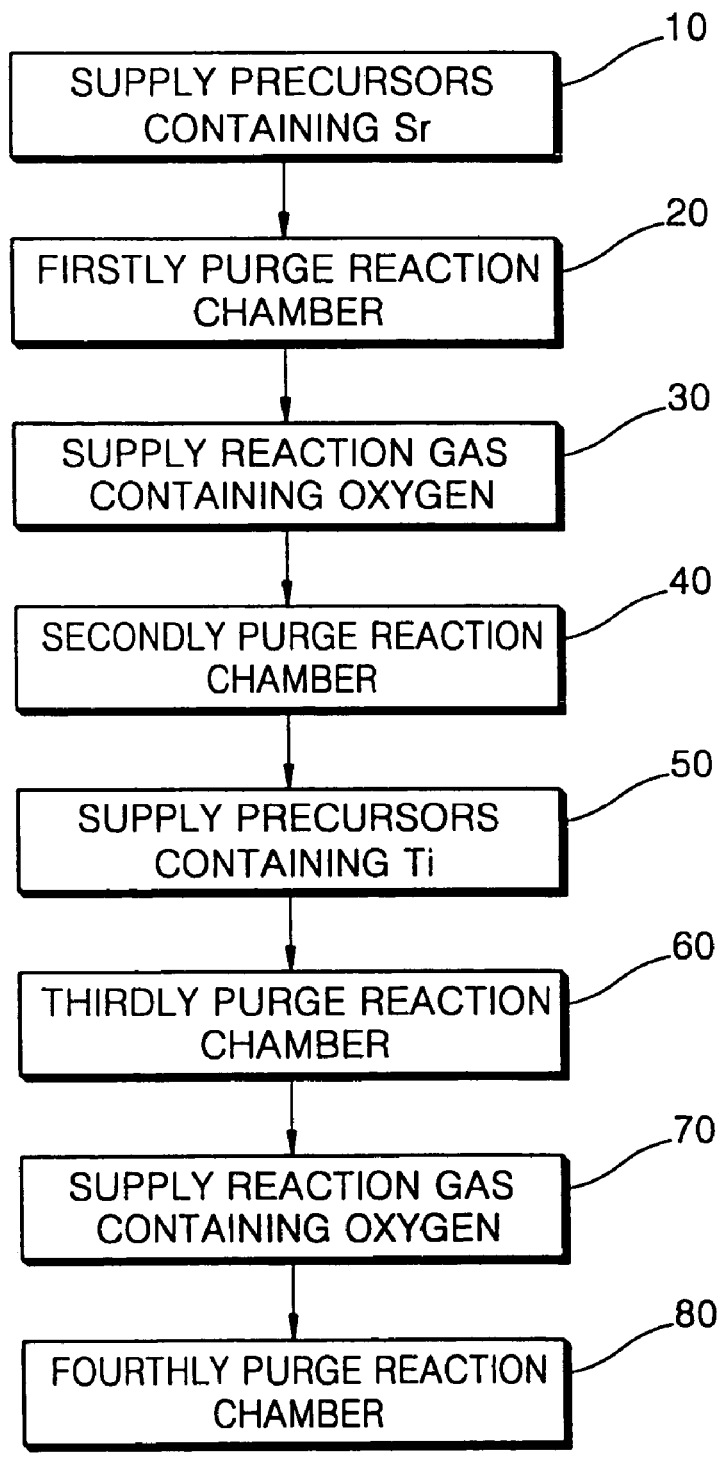
FIG. 1 illustrates a flowchart of steps constituting one cycle of a method of forming a thin film including multi components using ALD according to the prior art.
Figure 2:
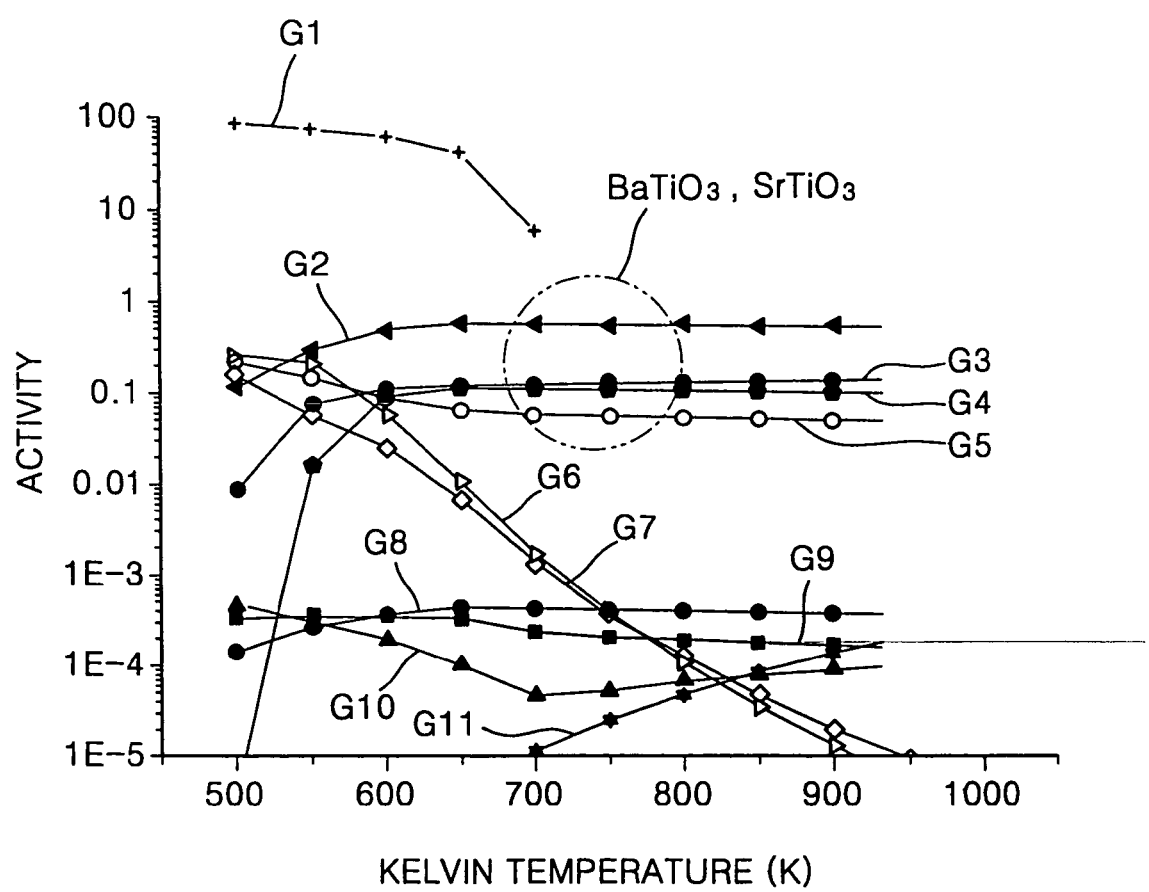
FIG. 2 illustrates a graph showing results of simulation of thermodynamic equilibrium of an $SrTiO_3$ layer, which is one thin film including multi components.
Figure 3:
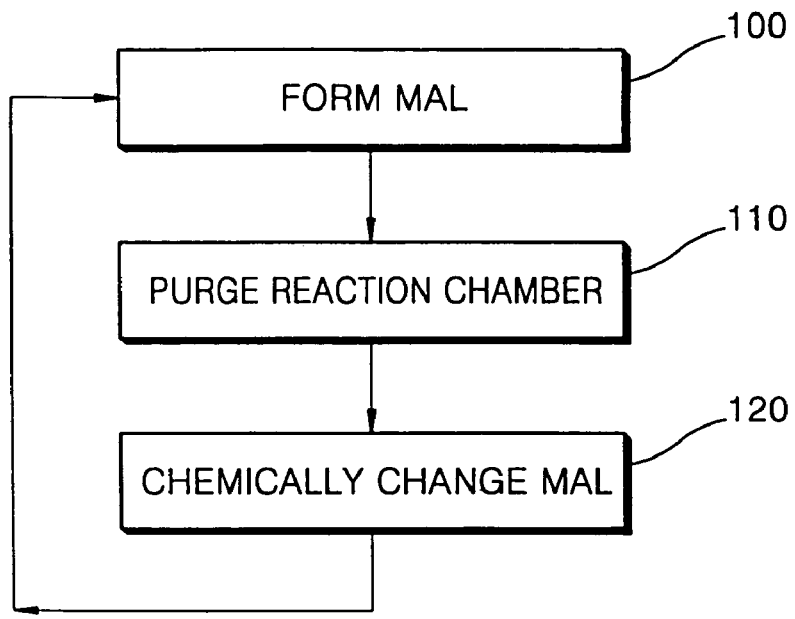
FIG. 3 illustrates a flowchart of steps constituting one cycle of a method of forming a thin film including multi components according to a first embodiment of the present invention.

Referring to FIG. 3, MALs, which form unit material layers of a thin film, are formed on a substrate in step 100. The MALs are formed of precursors containing components constituting the thin film. Thus, if the thin film is formed of three components, the MALs are formed of three precursors, each containing one of the three components, respectively. If the thin film is formed of four or more components, the MALs are formed of four or more precursors, each containing one of the four or more components, respectively.

To form the MALs, all components constituting the thin film are supplied into a reaction chamber in a predetermined amount in consideration of the composition ratio of the components and chemisorbed on the substrate. The MALs are single atomic layers composed of a plurality of components constituting the thin film.

As a detailed example of forming the MALs, if the thin film is a three component system oxide layer, e.g., an STO layer, the MALs are formed of a precursor containing Sr and a precursor containing Ti. In other words, a predetermined amount of the precursor containing Sr and a predetermined amount of the precursor containing Ti are supplied into the reaction chamber at a time. Here, it is preferable that the two precursors are supplied in a smaller amount than when the two precursors each form an atomic layer. This will be described later.

If the thin film is a BST layer containing three metal elements, the MALs are formed by supplying a predetermined amount of a precursor containing Ba, a predetermined amount of a precursor containing Sr, and a predetermined amount of a precursor containing Ti into the reaction chamber at a time. Here, it is preferable that the substrate is maintained at a predetermined reaction temperature so that the three precursors are chemisorbed on the substrate.

The thin film may be an oxide layer, a nitride layer, or a boride layer, as well as the STO layer and the BST layer. For example, the thin film may be a PZT layer, a YBCO layer, an SBTO layer, an HfSiON layer, a ZrSiO layer, a ZrHfO layer, a LaCoO layer, or a TiSiN layer.

If the thin film is an oxide layer, a nitride layer, or a boride layer, the MALs are oxidized, nitrified, or boronized in a subsequent process. This will be described later.

Precursors remaining after the MALs are formed on the substrate may be physisorbed on the MALs. The precursors physisorbed on the MALs may serve as particles in a subsequent process and prevent the MALs from being oxidized, nitrified, or boronized in a subsequent oxidation, nitrification, or boronization process. Thus, it is preferable that the precursors physisorbed on the MALs are removed. To remove the precursors physisorbed on the MALs, the reaction chamber is purged using an inert gas, e.g., a nitride gas or an argon gas, after the MALs are formed in step 110. As a result, the MALs, which form unit material layers constituting the thin film, remain as single atomic layers on the substrate. This is shown in FIGS. 4A and 4B.

Figure 4A:
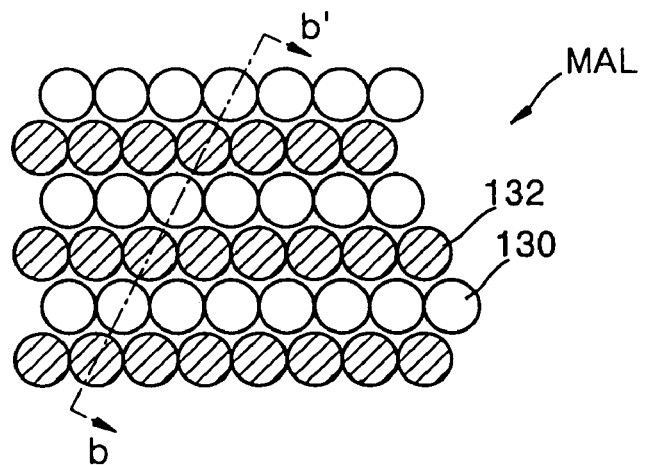
FIG. 4A illustrates a plan view of a mosaic atomic layer (MAL) which is formed by adsorbing different kinds of components constituting a thin film on the surface of a substrate after a first purge in one cycle of a method of forming the thin film according to the first embodiment of the present invention.
Figure 4B:
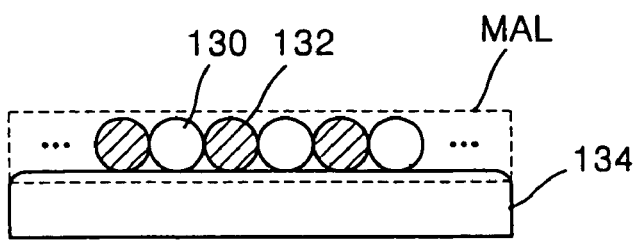
FIG. 4B illustrates a cross-sectional view taken along line b-b' of FIG. 4A.

FIG. 4A illustrates a plan view of the MALs and FIG. 4B illustrates a cross-sectional view taken along line b-b' of FIG. 4A. Reference numerals 130, 132, and 134 represent precursors containing first components constituting a thin film, precursors containing second components constituting the thin film, and a substrate, respectively. In FIGS. 4A and 4B, it is shown that the MALs may be formed of different precursors 130 and 132 each containing different components constituting the thin film.

The MALs are chemically changed by supplying a predetermined reaction gas into the reaction chamber in step 120. For example, the MALs are oxidized, nitrified, or boronized. Here, the substrate is heated to a predetermined temperature to react the reaction gas with the MALs.

The reaction gas may be supplied with external energy to lower the temperature for heating the substrate and increase the reaction activity of the reaction gas. The method of oxidizing, nitrifying, or boronizing the MALs depends on the method of supplying the external energy. For example, when the MALs are oxidized, radio frequency (RF) energy, a DC voltage, or microwave energy is applied to a reaction gas such as $O_2$, $O_3$, $H_2O$, and $H_2O_2$ containing oxygen during the supply of the reaction gas into the reaction chamber. Thus, the reaction gas is plasmatized. As a result, the MALs are oxidized using plasma.

If the external energy is ultraviolet, the MALs are oxidized by a reaction of decomposing $O_3$ under ultraviolet radiation. In other words, the MALs are oxidized in an ultraviolet-ozone process.

After the chemical change of the MALs is completed, first through third steps from forming to chemically changing the MALs are repeated until the MALs are formed to a desired thickness.

Second Embodiment

Unit material layers of a thin film are formed as MALs on a substrate by supplying components constituting the thin film by a time-sharing method. Here, the thin film is the same as the thin film described in the first embodiment.

Figure 5:
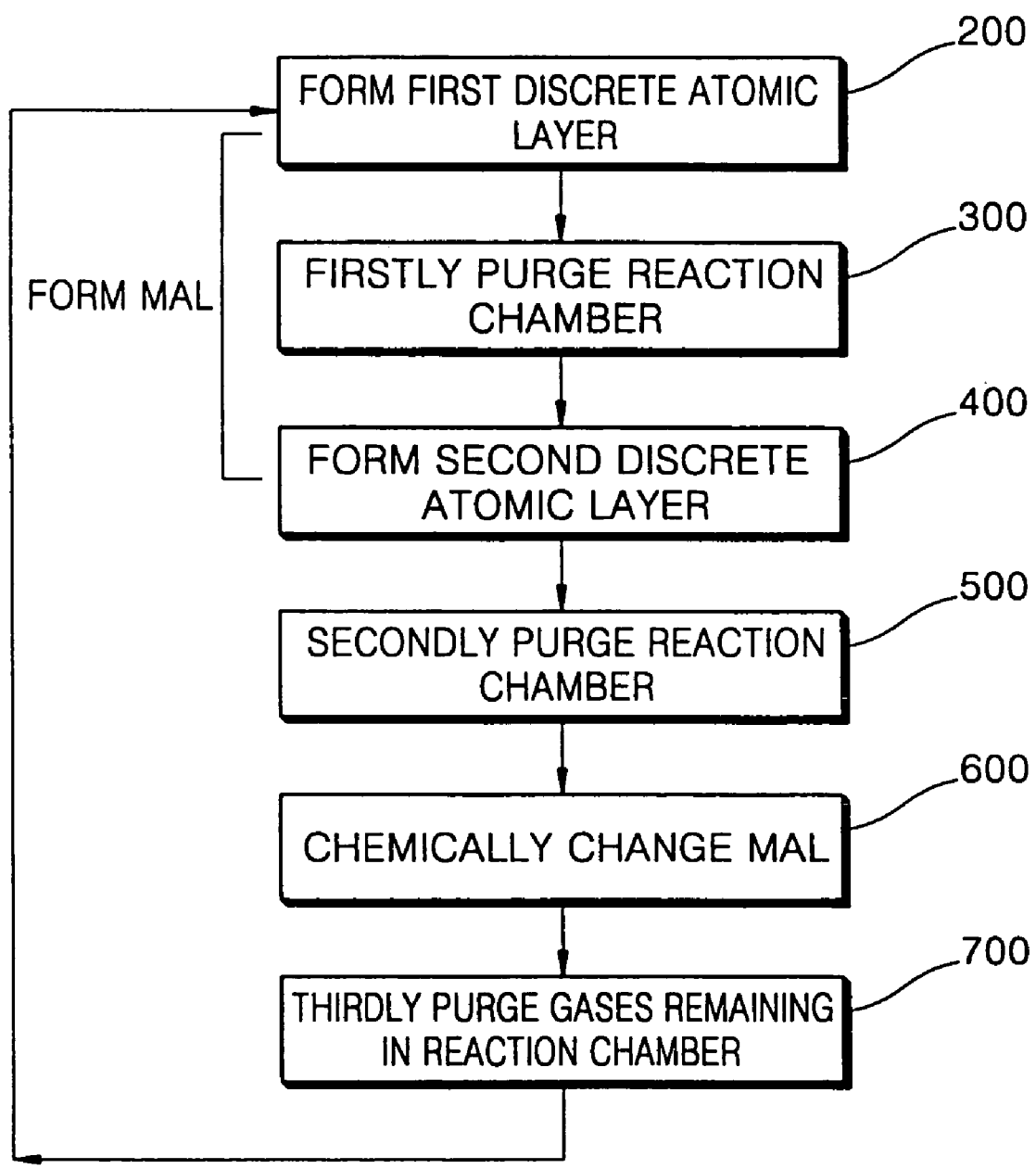
FIG. 5 illustrates a flowchart of steps constituting one cycle of a method of forming a thin film including multi components according to a second embodiment of the present invention.

Referring to FIG. 5, first atomic layers (hereinafter, referred to as "first discrete atomic layers) are formed of precursors which are spaced apart from each other in step 200, in contrast to conventional atomic layers that are formed to completely cover the entire surface of the substrate (on the entire surface of the structure if a structure is formed on the substrate). The conventional atomic layers are continuous atomic layers. In contrast, according to the present invention, precursors containing first components of components constituting a thin film are discrete on the substrate to form the first discrete atomic layer. That is, the component precursors are generally not contiguous to other component precursors of the same type, and do not saturate the surface. The precursors are supplied at sub-saturation levels to yield discrete precursors that are adsorbed on the surface at some distance from other precursors of the same type. Here, the precursors are uniformly discrete on the entire surface of the substrate. Second components constituting the thin film, which will be supplied later, may be uniformly chemisorbed, in the same overall layer, between the first components. Here, it is preferable that the substrate is maintained at a reaction temperature so that the supplied components are chemisorbed on the substrate. The components may be heated to the reaction temperature or a temperature close to the reaction temperature in the course of being supplied.

Figure 6A:
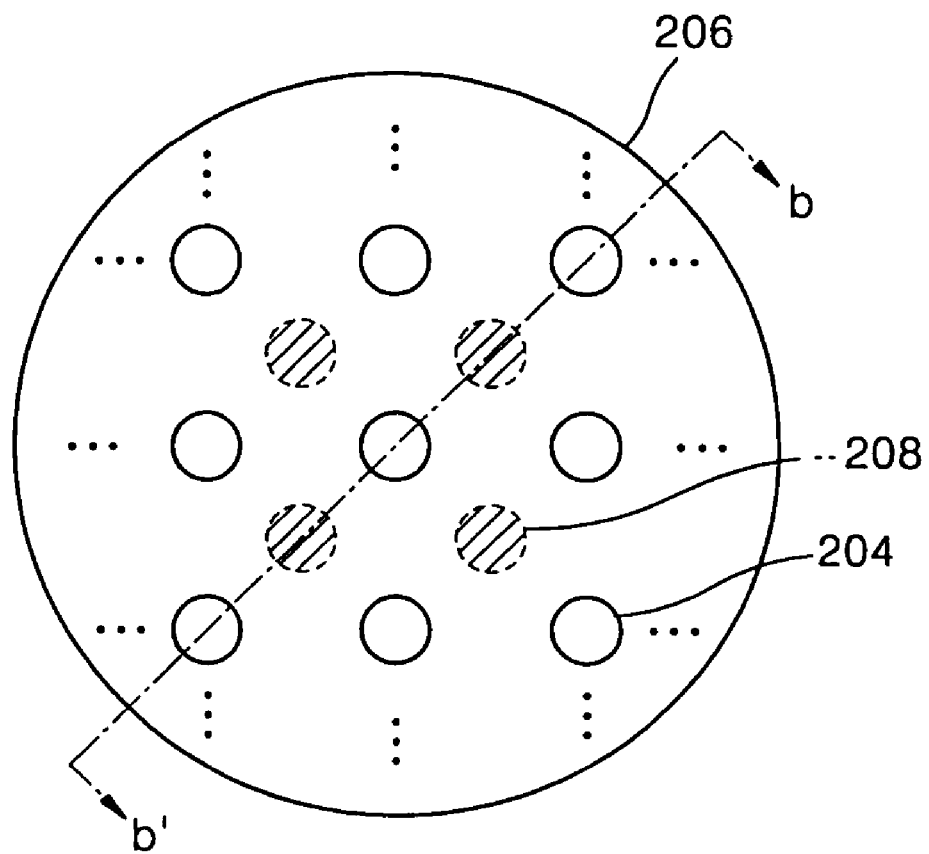
FIGS. 6 through 8 illustrate plan and cross-sectional views of an atomic layer formed of first precursors containing first components of a thin film, which are chemisorbed on a substrate after a first purge in one cycle of a method of forming a thin film according to the second embodiment of the present invention.
Figure 6B:
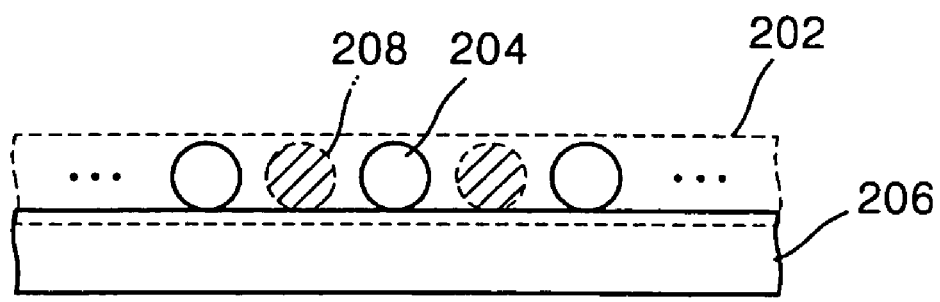

FIG. 6A illustrates a plan view of the first discrete atomic layer formed of precursors containing the first components and FIG. 6B illustrates a cross-sectional view taken along line b-b' of FIG. 6A. Here, reference numeral 202 represents the first discrete atomic layer, reference numeral 204 represents precursors (hereinafter, referred to as "first precursors") containing the first components constituting the first discrete atomic layer, and reference numeral 206 represents a substrate on which the first discrete atomic layer 202 is chemisorbed. A thin film, which is formed on the substrate 206, contains at least three components. At least two of the three components are chemisorbed on the substrate 206.

For example, if the thin film is a thin film including multi components such as an $SrTiO_3$ layer or a $BaTiO_3$ layer containing three components, the first precursors 204 contain strontium (Sr), barium (Ba), or Titanium (Ti). The first discrete atomic layer 202 is formed by chemisorbing the precursors containing strontium (Sr) or barium (Ba) on the substrate 206.

Steps of forming the thin film containing the three components are also applied to a thin film containing four components. Here, if an oxygen component is contained in the four components, the first precursors 204 contain any of the other four components (i.e. not the oxygen component). Chemisorbing the precursors on the substrate forms the first discrete atomic layer 202, which is uniformly discrete.

As shown in FIG. 6B, unlike the precursors constituting the conventional continuous atomic layers, the first precursors 204 constituting the first discrete atomic layer 202 are widely discrete on the substrate 206. Reference numeral 208 represents vacant regions for second precursors (second precursors will be formed between the first precursors 204 in a subsequent process).

Figure 7:
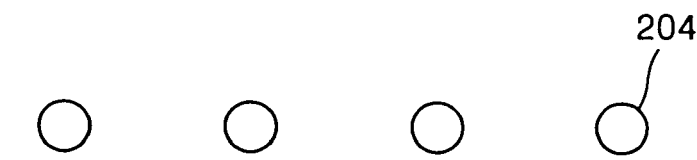
Figure 8:
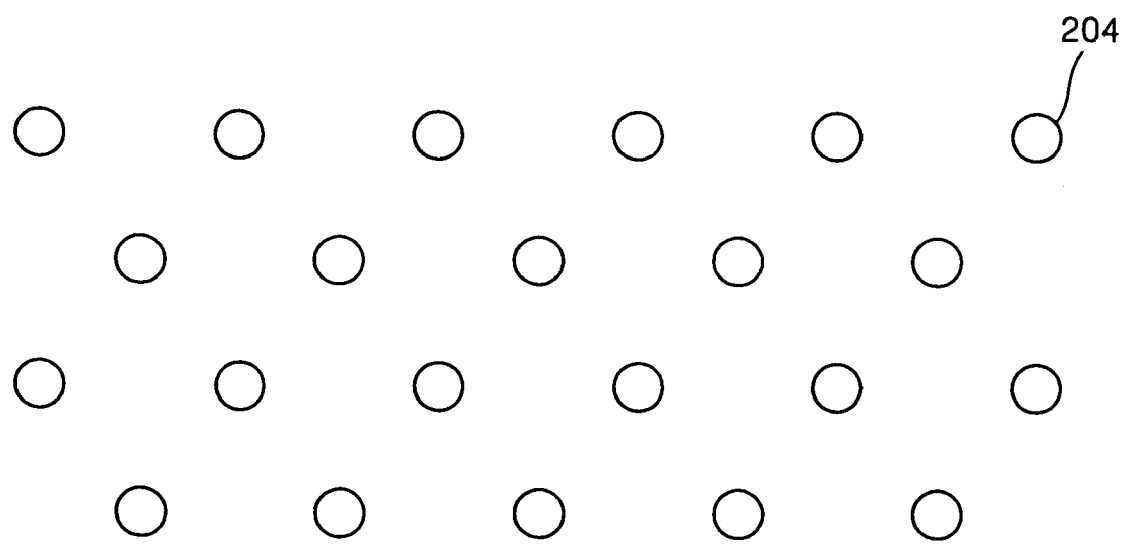

The distribution of the first precursors 204 may vary, depending on the kinds of first precursors 204 and second precursors subsequently formed in vacant regions 208. For example, as shown in FIGS. 7 and 8, the first discrete atomic layer 202 (FIGS. 6A and 6B) may have a structure in which precursors 204 are arranged in an oblique line, or in which precursors 204 are arranged in a hexagonal shape with one precursor in the center.

The characteristics of the shape of the first discrete atomic layer 202, i.e., the distance between the first precursors 204, are determined by the amount of the first precursors 204 supplied. For example, if the thin film is an $SrTiO_3$ layer, the first discrete atomic layer 202 is formed of Sr precursors. Also, the distribution of the first discrete atomic layer 202 is determined by the amount of Sr precursors supplied into the reaction chamber. Preferably, the Sr precursors are supplied in a smaller amount than Sr precursors supplied to form an $SrTiO_3$ layer by a conventional method of forming an atomic layer.

Figure 12:
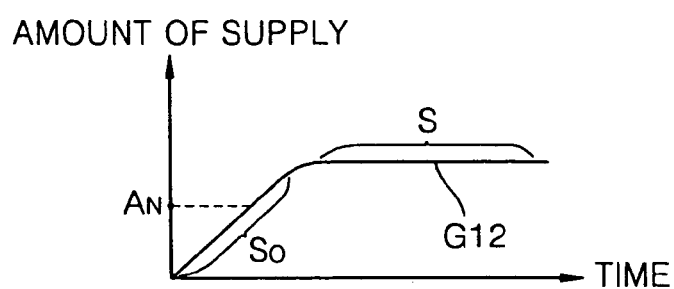
FIG. 12 illustrates a graph explaining a region which is supplied with a source gas for forming a thin film according to the first and second embodiments of the present invention.

In detail, G12 of FIG. 12 is a graph showing changes in the amount of Sr precursors with respect to time when an $SrTiO_3$ layer is formed by the conventional method of an atomic layer. Reference numeral S represents a saturated region. The saturated region S represents a region in which a sufficient amount of the Sr precursors is supplied so that the Sr precursors are adsorbed on the entire surface of the substrate. Reference numeral $S_0$ is an initial region, in which the supply of Sr precursors begins, and becomes the saturated region S as time passes. Thus, the amount of Sr precursors supplied in the initial region $S_0$ is smaller than the amount of Sr precursors supplied in the saturated region S. As a result, the substrate is not completely covered with only the amount of Sr precursors supplied in the initial region $S_0$. There is no cause for the Sr precursors to be adsorbed onto only a particular region of the substrate during the supply of Sr precursors into the reaction chamber. In other words, the probability that the Sr precursors supplied into the reaction chamber are adsorbed on any particular region of the substrate in any one step is equivalent to the concentration of the Sr precursors. As a result, the Sr precursors supplied in the initial region $S_0$ are discrete on the substrate.

As shown in FIGS. 6A and 6B, the first discrete atomic layer 202 containing the first components having various distribution shapes as described above may be formed by controlling the amount of precursors supplied on the substrate in the initial region $S_0$. Vacant regions 208, on which second precursors containing second components may be adsorbed, exist between the first precursors 204 on the substrate.

As described above, the shape of the first discrete atomic layer 202 may be determined by limiting the amount of precursors supplied into the reaction chamber to that of the initial region $S_0$ (FIG. 12). Even in this case, it is preferable that the amount of precursors required for forming the first discrete atomic layer 202 containing the first components varies according to the number of components constituting the thin film, the composition ratio of the components, and the order of forming the components, i.e. which component is first formed.

For example, supposing that the first discrete atomic layer 202 containing the first components is formed during the formation of a thin film containing three components, and reference numeral $A_N$ of FIG. 12 represents the amount of precursors. The amount of precursors supplied for forming an initial atomic layer on a substrate during the formation of a different thin film containing four or more components may be smaller than or equal to the amount $A_N$ of the three-component film, depending on which one of the four components the initial atomic layer contains.

Referring to FIGS. 5 and 6, the reaction chamber is purged for the first time in step 300. It is preferable that the first precursors 204 are all used in forming the first discrete atomic layer 202 containing the first components. However, a portion of the first precursors 204 may not be used in forming the first discrete atomic layer 202. If the first precursors 204 remain in the reaction chamber, the first precursors 204 are mixed with other precursors that may be supplied later. As a result, a thin film having an unwanted shape may be formed. Thus, it is preferable that any of the first precursors 204 which are not used in forming the first discrete atomic layer 202 are discharged from the reaction chamber. In other words, in step 300, the reaction chamber is purged using an inert gas which does not react chemically, to discharge precursors not used in forming the first discrete atomic layer 202. Here, the inert gas is Ar, $N_2$, or $O_2$.

A second discrete atomic layer composed of precursors containing second components is formed in step 400. Here, the precursors (hereinafter, referred to as "second precursors") constituting the second discrete atomic layer are chemisorbed on vacant portions 208 of the substrate, between the first precursors. That is, the first and second discrete atomic layers are interspersed on the surface of the substrate, as indicated in FIG. 6B.

In detail, after the first purge in step 300, a predetermined amount of the second precursors is supplied into the reaction chamber. Here, the second precursors contain the second components, which are selected from components constituting the thin film, and may be chemisorbed on the substrate.

For example, if the thin film is a $SrTiO_3$ layer or a $BaTiO_3$ layer, the second precursors contain Ti. If the first precursors 204 contain Ti, the second precursors contain Sr or Ba. This may be applied to a thin film containing four or more components, three or more components of which are adsorbed on the substrate.

It is preferable that the second precursors are supplied in consideration of the following. If the second precursors contain the last one of the components contained in the thin film which are chemisorbed on the substrate, it is preferable that the second precursors are sufficiently supplied so that the second precursors are all adsorbed on vacant regions of the first discrete atomic layer 202 containing the first components, i.e., on regions of the substrate on which the first precursors are not adsorbed.

Figure 9A:
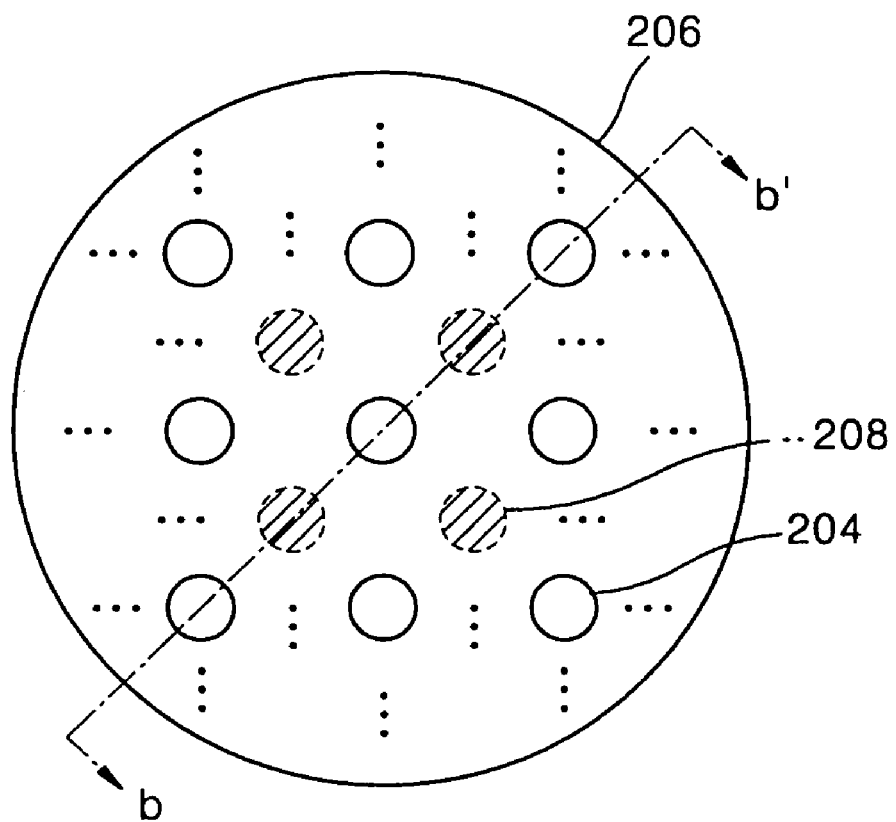
FIGS. 9 through 11 illustrate plan and cross-sectional views of an MAL formed of second precursors containing second components of a thin film, which are adsorbed on portions of a substrate between the first precursors containing the first components after a second purge in one cycle of a method of forming a thin film according to the second embodiment of the present invention.
Figure 9B:
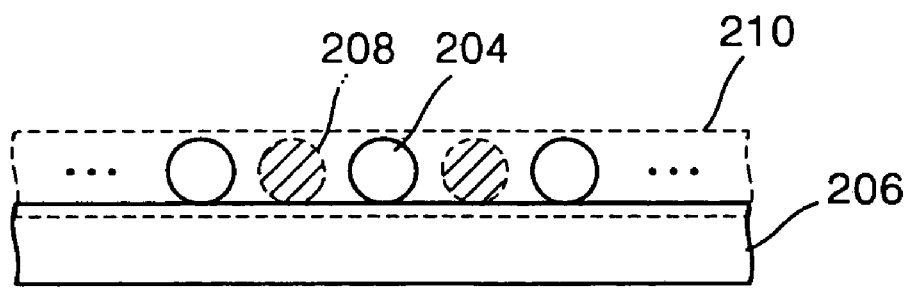
Figure 10A:
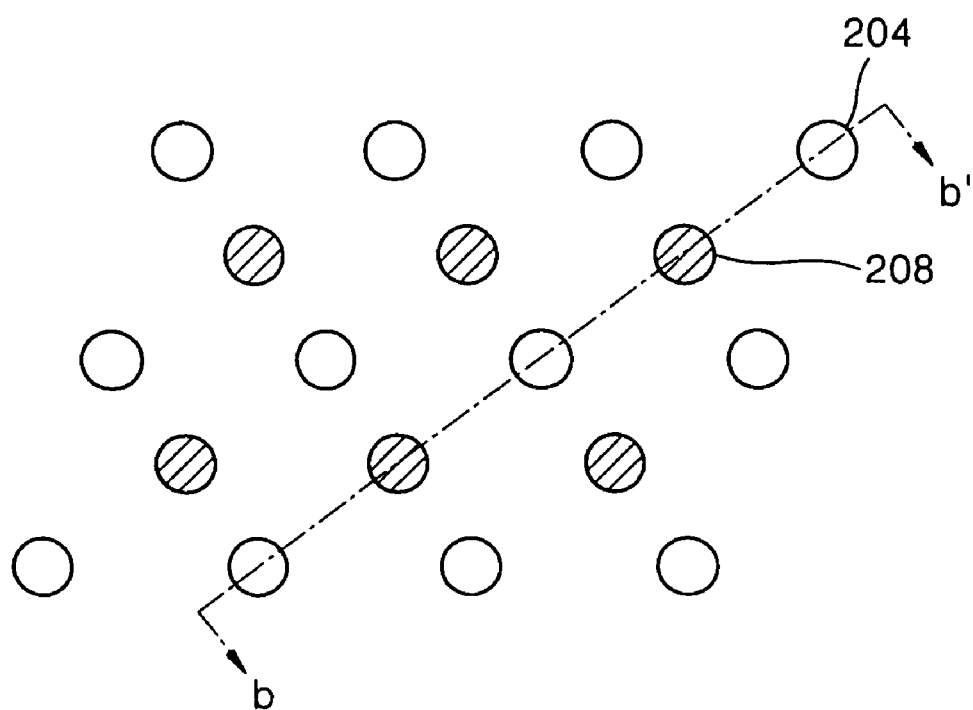
Figure 10B:
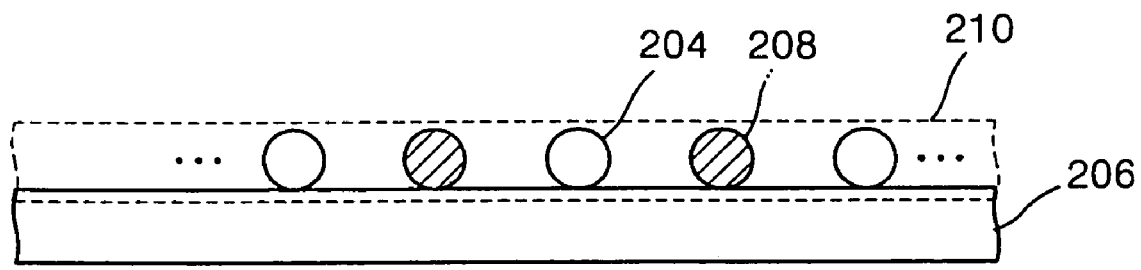
Figure 11A:
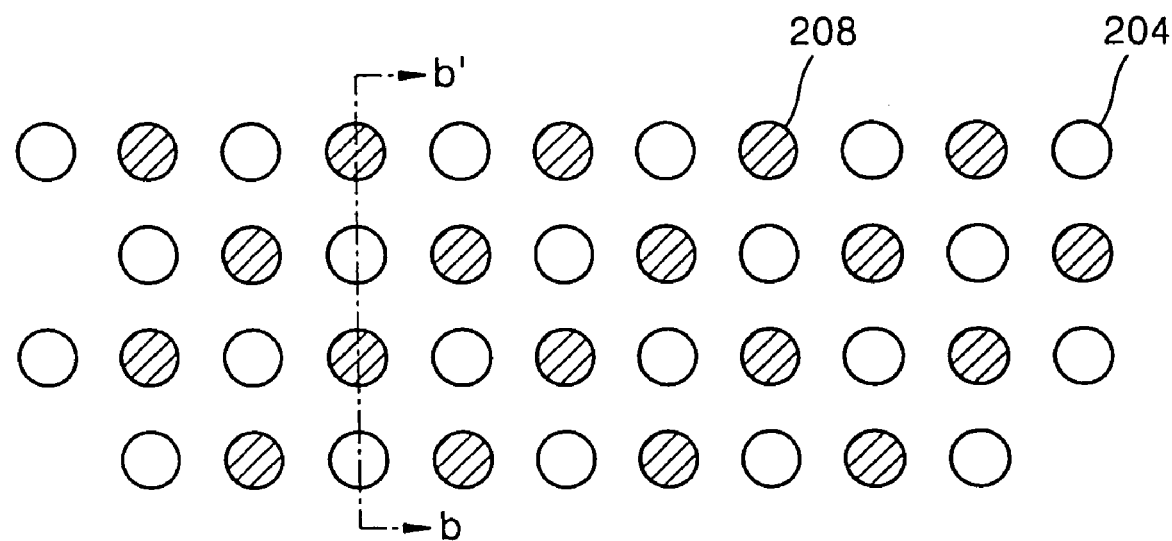
Figure 11B:
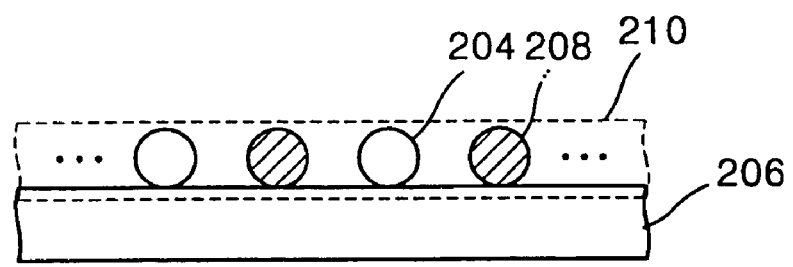

If the second precursors do not contain the last component, third and fourth precursors which are chemisorbed are continuously supplied after the second precursors are supplied. Thus, it is preferable that first precursors are supplied in an amount sufficient for leaving predetermined vacant regions on the substrate between the first precursors on which subsequent precursors are chemisorbed. As a result, subsequent precursors may be chemisorbed between the first and second precursors even though the first and second precursors are adsorbed on the substrate. Thus, in the latter case, it is preferable that the second precursors are supplied in the amount supplied in the initial region $S_0$ (FIG. 12) as when the first precursors are supplied. However, the second precursors may be supplied in a larger or smaller amount than the first precursors, according to the composition ratio of the components contained in the second precursors accounting for the thin film. In a case where the component ratio of the components contained in the first precursors is identical to the component ratio of the components contained in the second precursors, and only the first and second precursors are restricted as being chemisorbed, it is preferable that the amount of the first precursors and the amount of the second precursors are equal in the initial region $S_0$. That is, for example, if a unit material layer includes equal parts Sr and Ti, it is preferable that both Sr and Ti-containing precursors are supplied at equal, sub-saturation levels. Referring to FIGS. 9A and 9B, a mosaic atomic layer (MAL) 210, which is composed of the first precursors 204 constituting the first discrete atomic layer 202 and the second precursors, formed in vacant regions 208, constituting the second discrete atomic layer (and may be the same as the first discrete atomic layer 202 shown in FIG. 6), is formed on the substrate 206 as a unit material layer constituting the thin film through the steps 200, 300, and 400 as shown in FIG. 5. If the MAL 210 of FIG. 9 is formed of only the first precursors 204 and second precursors (which are formed in vacant regions 208), it is preferable that the first precursors 204 and second precursors (which are formed in vacant regions 208) contact each other. However, in FIG. 9, the first precursors 204 and second precursors (which are formed in vacant regions 208) are shown spaced apart from each other for convenience. This is applied to various examples of the MAL 210 due to various arrangement shapes of the first precursors 204 shown in FIGS. 10 and 11.

Referring again to FIG. 5, the reaction chamber is purged for the second time in step 400. In other words, for the same reason as in step 300, the reaction chamber is purged using an inert gas after the MAL 210 of FIG. 9 is formed.

The MAL 210 is chemically changed in step 600. In other words, the MAL 210 is oxidized, nitrified, or boronized using several reaction gases. When bulky ligands are decomposed and removed due to this chemical reaction, new chemisorbed points which were covered by the ligands may be exposed.

To oxidize the MAL 210, reaction gas such as $O_2$, $O_3$, $H_2O$, and $H_2O_2$ is supplied into the reaction chamber in a predetermined amount and reacts with the MAL 210. Here, when the reaction gas is supplied into the reaction chamber, radio frequency (RF) or microwave energy, or a DC voltage, may be applied to the reaction gas, to increase the activity of the reaction gases. Thus, the reaction gas may form plasma in the reaction chamber. If the reaction gas is ozone, ultraviolet (UV) is applied to the reaction gas to increase the activity of the reaction gas. In other words, the MAL 210 is oxidized using UV-$O_3$.

The reaction chamber is purged for the third time in step 700. The gases remaining in the reaction chamber after step 500 are purged using the inert gas.

Steps 200, 300, 400, 500, 600, and 700 are repeated until the thin film is formed to a desired thickness.

If third and fourth precursors are further chemisorbed on the substrate after the second purge in step 500, i.e., if the thin film is not a nonoxide layer containing at least three components or an oxide layer containing four or more components, a step of forming an atomic layer composed of third precursors containing third components, a third purge step, a step of forming an atomic layer composed of four precursors containing four components, and a fourth purge step, are sequentially performed before step 700.

When the formation of the MAL is repeated to form the thin film, the compositions of the formed MALs may be different from each other. In other words, when components constituting a subsequent MAL are the same as components constituting a former MAL, the relative amount of the precursors constituting the two MALs, i.e., the relative amount of the components constituting the thin film, may be different from the former MAL to the subsequent MAL.

For example, if the thin film is an STO layer having a predetermined thickness, the STO layer may be formed to a desired thickness by repeatedly forming a unit material layer composed of Sr precursors and Ti precursors, i.e., an Sr—Ti MAL. However, if three Sr—Ti MALs are sequentially formed to form the STO layer, the relative amounts of precursors constituting a second or third Sr—Ti MAL may be different from the relative amounts of precursors constituting a first Sr—Ti MAL. The relative amounts may be controlled by controlling the relative amounts of precursors supplied into the reaction chamber.

The MAL 210 may be formed by supplying the second precursors two times in step 400. In other words, the second discrete atomic layer is not completely formed by supplying the second precursors only one time. Thus, the second precursors are supplied for the first time in a predetermined amount to form the second discrete atomic layer. Next, purging is performed, and then the second precursors are supplied for the second time in a predetermined amount, to complete the second discrete atomic layer. If the second discrete atomic layer is not completely formed after the second precursors are supplied for the second time, the second precursors may be supplied for the third time. Also, the amount of the second precursors may be different in the first and second supplies.

This method may be applied to the thin films containing three or more components described in the first embodiment as well as the STO layer.

Third Embodiment

A unit material layer is formed of two MALs. In detail, if a thin film to be formed contains at least three components, the three components are divided into two groups and the two groups are each formed as MALs.

For example, if the thin film contains three components, i.e., $A_{2-X-Y}B_XC_Y$, a first MAL ($A_{1-X}B_X$) composed of precursors containing a component A (hereinafter, referred to as "precursors A") and precursors containing a component B (hereinafter, referred to as "precursors B") is formed on a substrate. Next, a second MAL ($A_{1-Y}C_Y$) composed of the precursors A and precursors containing a component C (hereinafter, referred to as "precursors C") is formed on the first MAL ($A_{1-X}B_X$). Here, the first and second MALs may be formed according to the first and second embodiments. Also, the first MAL may be oxidized before the second MAL is formed so that the second MAL is chemisorbed on the first MAL. The first MAL is oxidized according the oxidation process described in the first or second embodiment. It is preferable that purging is performed among the steps of forming the second MAL. After the second MAL is formed, the second MAL is oxidized according to the process of oxidizing the first MAL. Thus, the combination of the first and second MALs forms a unit material layer having the same components as the thin film. Next, the processes of forming the first and second MALs are repeated on the oxidized second MAL, to form the thin film to a desired thickness.

The thin film formed by the method of forming a thin film according to the third embodiment of the present invention may correspond to all of the thin films described in the process of forming a thin film according to the first embodiment.

As an example, if the thin film is a PZT layer, precursors A, B, and C represent precursors containing Pb, precursors containing Zr, and precursors containing Ti, respectively. The first and second MALs are a first MAL composed of the precursors containing Pb and Zr, and a second MAL composed of the precursors containing Pb and Ti, respectively. Also, if the thin film is a BST layer, the precursors A, B, and C represent precursors containing Ba, precursors containing Sr, and precursors containing Ti, respectively, and the first and second MALs are a first MAL composed of the precursors Ba and Sr, and a second MAL composed of the precursors containing Ba and Ti, respectively.

Fourth Embodiment

A thin film is formed of unit material layers, a portion of which are MALs and the others of which are atomic layers (ALs) on the MALs. In other words, unit material layers constituting the thin film are formed of MALs and ALs. The ALs are non-mosaic atomic layers.

In detail, if the thin film contains three or more components, e.g., components A, B, and C as described in the third embodiment, an MAL is formed of precursors A and B, each containing the components A and B, on a substrate. Here, the MAL is formed by the methods described in the first, second, and third embodiments. Next, a reaction chamber is purged. An AL is formed of the precursors C, containing the component C, on the MAL. Here, it is preferable that the AL is formed, preferably chemisorbed, after the MAL is oxidized as described in the second embodiment.

Thus, the unit material layer is formed of the MAL, composed of the precursors A and B, and the AL, composed of the precursors C, on the substrate. The MAL may be formed of the precursors A and C instead of the precursors A and B. Thus, the AL may be formed of the precursors B.

The AL is formed of the precursors C on the MAL and oxidized by the same method as when oxidizing the MAL. The thin film is formed to a desired thickness by repeating former steps on the oxidized AL.

Fifth Embodiment

An oxidization gas or a deoxidization gas is supplied to react with chemically adsorbed precursors containing at least two kinds of components, e.g., Sr and Ti. By-products generated in this process, e.g., hydrocarbon-based by-products, may exist on the surface of the MAL.

In a process of forming a thin film including multi components containing at least two kinds of metallic atoms using an MAL process or an ALD process, it is difficult to perform a subsequent cycle of the MAL process or the ALD process due to these by-products. Thus, it is necessary to remove the by-products, and the fifth embodiment of the present invention is directed to this removal.

Figure 13:
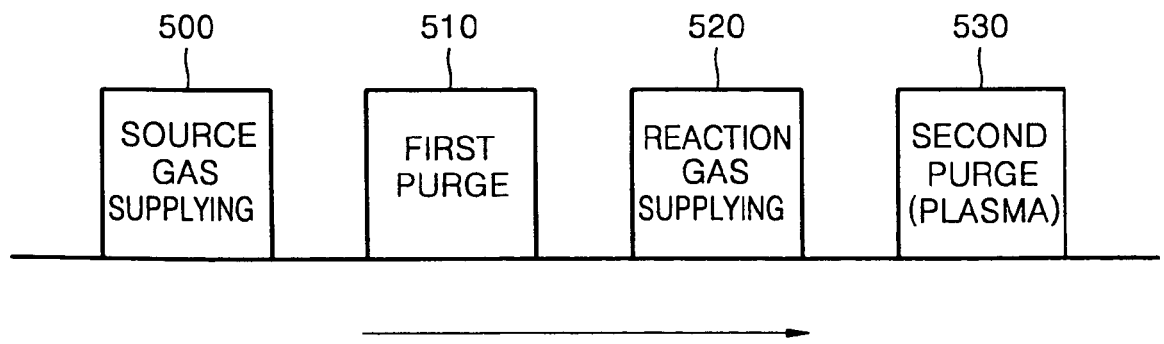
FIG. 13 illustrates a view of one cycle of a method of forming a thin film including multi components according to a fifth embodiment of the present invention.

In detail, referring to FIG. 13, three steps are sequentially performed: supplying a source gas to form the MAL, step 500; firstly purging remainder that is not adsorbed after the supply of the source gas step 510; and supplying a reaction gas (an oxidization or deoxidization gas) to oxidize or deoxidize the MAL, step 520. Thereafter, a second purge step 530 is performed to remove by-products generated due to the reaction of the MAL precursors and the reaction gas. In the second purge step 530, a purge gas is an inert gas such as Ar, He, Ne, or $N_2$. In the second purge step 530 using the purge gas, DC-bias is applied to the substrate to increase an efficiency of removing the by-products so as to make the inert gas into plasma. In other words, inert gaseous plasma is generated and used as the purge gas in the second purge step 530. Positive ions of the inert gaseous plasma bombard against the surface of the MAL, which results in the removal of the by-products adsorbed on the surface of the MAL.

As described above, a thin film which is less contaminated by impurities may be formed by using the inert gaseous plasma as the purge gas after supplying the reaction gas. In particular, the bombardment of ions having high energy against the by-products adsorbed on the surface of the MAL can achieve a high temperature deposition effect although the thin film is deposited at a low temperature.

The fifth embodiment of the present invention, as described above, may be applied to the ALD process containing two kinds of components as well as the MAL deposition process.

X-ray diffraction analysis of a thin film formed by a method of forming a thin film including multi components according to the present invention and of a thin film formed by a conventional atomic layer deposition method will be described. Here, the thin films including multi components are $SrTiO_3$ layers.

Figure 14:
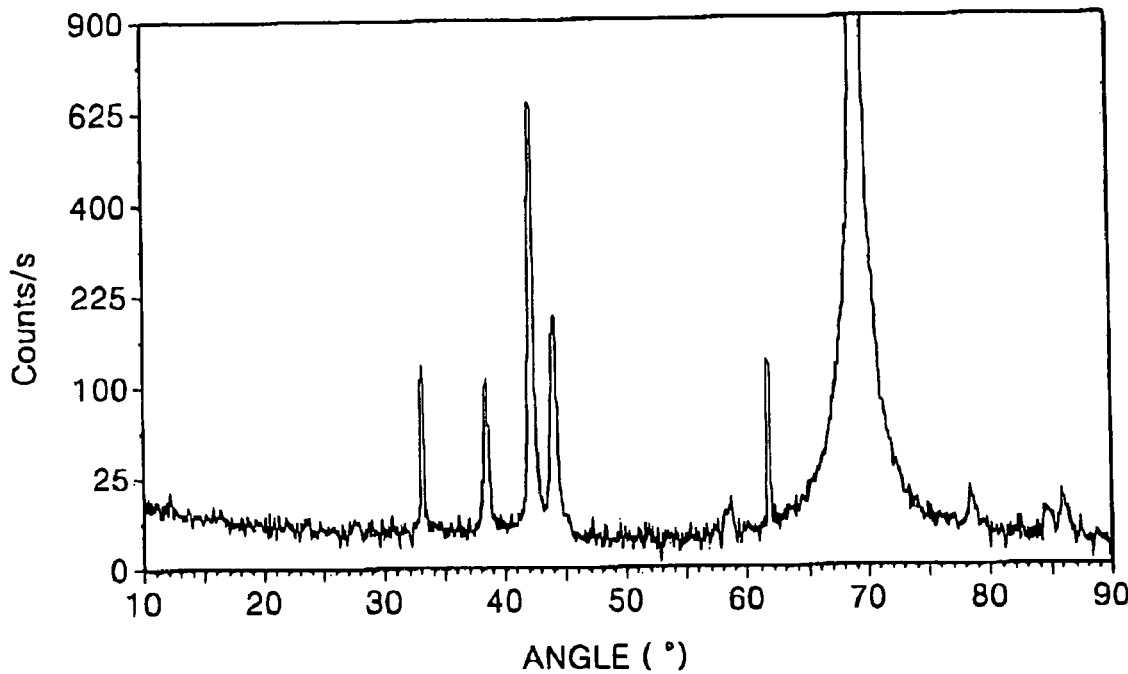
FIGS. 14 and 15 respectively illustrate graphs comparing X-ray diffraction analysis of a thin film formed by a conventional atomic layer deposition method with X-ray diffraction analysis of a thin film formed according to the present invention.
Figure 15:
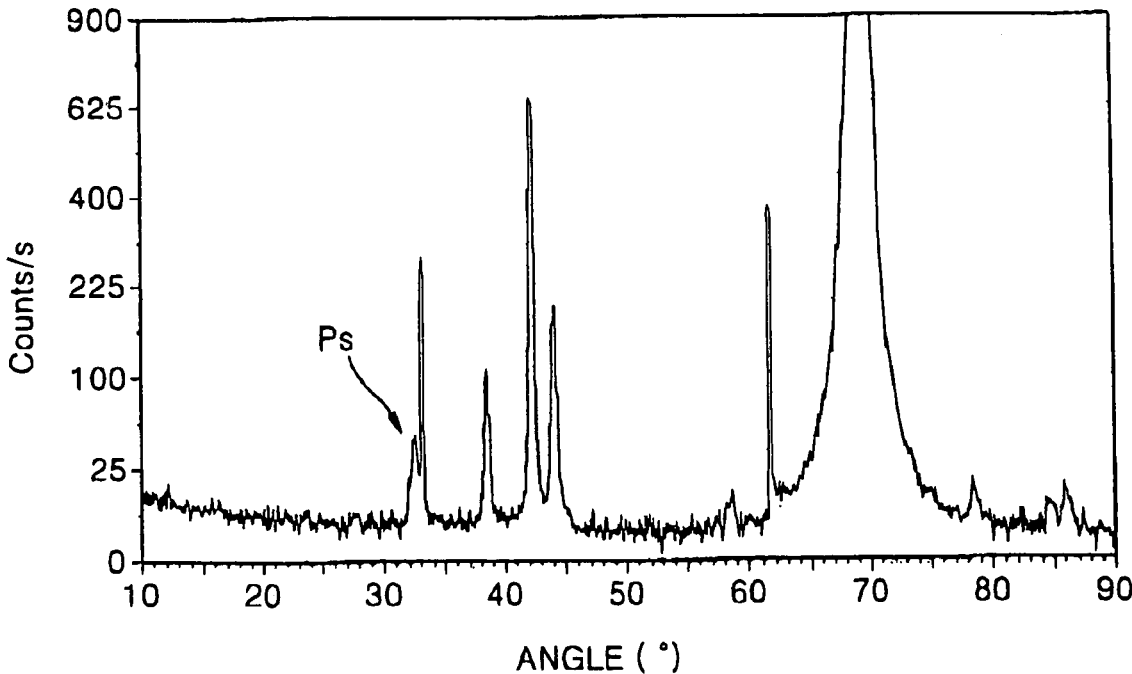

In detail, FIG. 14 shows the results of X-ray diffraction analysis of a thin film formed according to the prior art. FIG. 15 shows the results of X-ray diffraction analysis of a thin film formed according to the present invention.

In FIG. 14, peaks due to ruthenium (Ru) and silicon (Si) are shown, and in FIG. 15, peaks due to ruthenium (Ru), silicon (Si), and $SrTiO_3$ are shown. Reference numeral Ps in FIG. 15 is the peak due to $SrTiO_3$.

Conventionally, there are no peaks showing the crystallization of the thin film including multi components. In the present invention, there are peaks showing the crystallization of the thin film including multi components.

Accordingly, unlike the in conventional processes, after a thin film including multi components is formed according to the embodiments of the present invention, an additional thermal treatment for the crystallization of the thin film is unnecessary.

Figure 16:
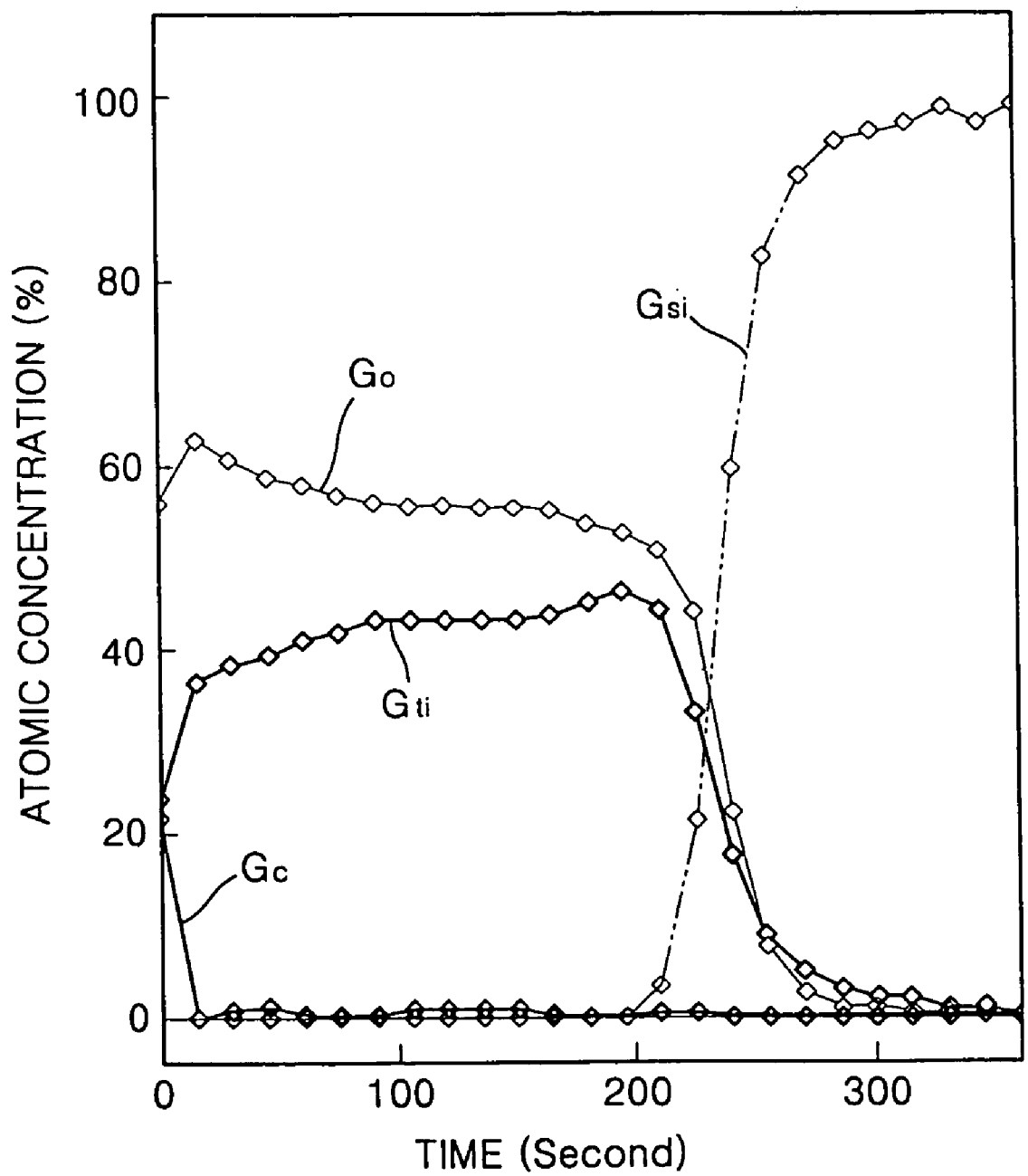
FIGS. 16 and 17 illustrate graphs showing carbon content, which is measured to observe the degree of oxidization of a thin film including multi components according to the first and second embodiments of the present invention.
Figure 17:
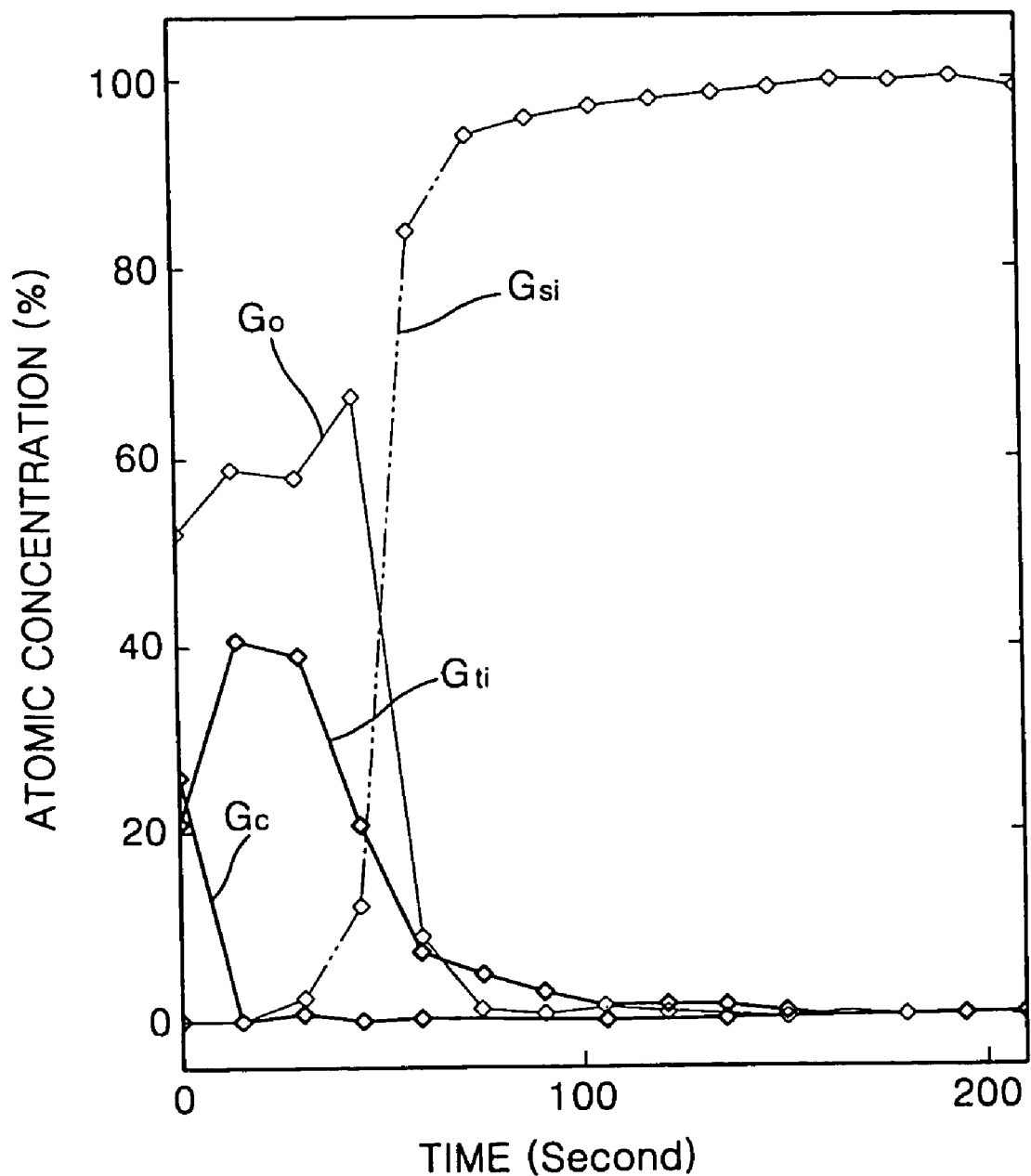

FIGS. 16 and 17 are graphs showing the analysis of titanium content after a titanium layer is formed on a substrate and oxidized, to observe the possibility of oxidization of a thin film including multi components according to the first through fourth embodiments of the present invention. FIG. 16 shows the result after a titanium atomic layer is formed on a substrate, a titanium layer is physisorbed on the titanium atomic layer, and a process of oxidizing the resultant structure is repeated. FIG. 17 shows the result after a titanium atomic layer is formed on a substrate and a process of oxidizing the resultant structure is repeated. In FIGS. 16 and 17, reference numerals $G_o$, $G_{ti}$, $G_{si}$, and $G_c$ represent changes in the contents of oxygen, titanium, silicon, and carbon, respectively. Here, it is noted that the whole titanium layer is oxidized on a substrate, and the carbon component is less than 0.5%. From this result, it is noted that the first and second MALs may be formed and fully oxidized at the same time. Also, at least two MALs may be formed on the substrate and then oxidized at the same time, as a cycle by which a unit material layer is formed on the substrate.

A thin film formed by a method of forming a thin film according to embodiments of the present invention will now be described.

First Embodiment

Figure 18:
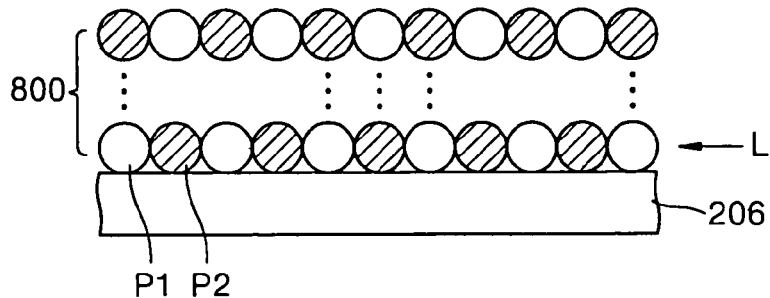
FIGS. 18 through 20 illustrate cross-sectional views of a thin film formed according to first through third embodiments of the present invention.

As shown in FIG. 18, a thin film 800 is formed of a plurality of unit material layers L on a substrate 206. The unit material layers L are composed of first components P1 and second components P2. Here, the thin film 800 may include at least one of an oxide layer, a nitride layer, and a boride layer. The thin film 800 may include at least one of an STO layer, a PZT layer, a BST layer, a YBCO layer, an SBTO layer, an HfSiON layer, a ZrSiO layer, a ZrHfO layer, a LaCoO layer, and a TiSiN layer.

The unit material layers L are preferably MALs composed of components of which the thin film is composed. Thus, if the thin film is composed of first through third components, the unit material layers L are MALs which are composed of the first through third components. If the thin film is composed of first through fourth components, the unit material layers L are MALs which are composed of the first through fourth components.

Second Embodiment

Figure 19:
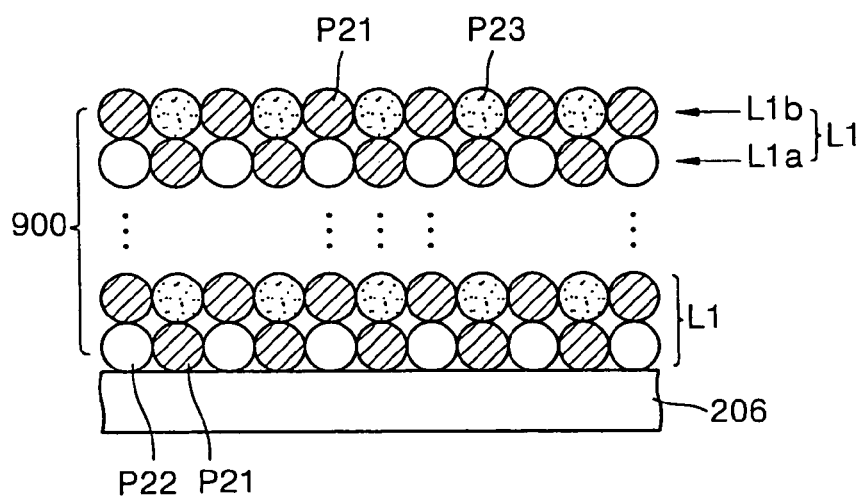

In the second embodiment, a thin film is formed of three components having a predetermined composition. As shown in FIG. 19, a thin film 900 is formed of a plurality of unit material layers L1, which are each double MALs (i.e., have two MALs). In other words, a unit material layer L1 is composed of double MALs: a first MAL L1a and a second MAL L1b, which are sequentially formed. The first MAL L1a is composed of first components P21 and second components P22 of which the thin film 900 is composed. The second MAL L1b is composed of the first components P21 and third components P23, of which the thin film 900 is composed.

Third Embodiment

Figure 20:
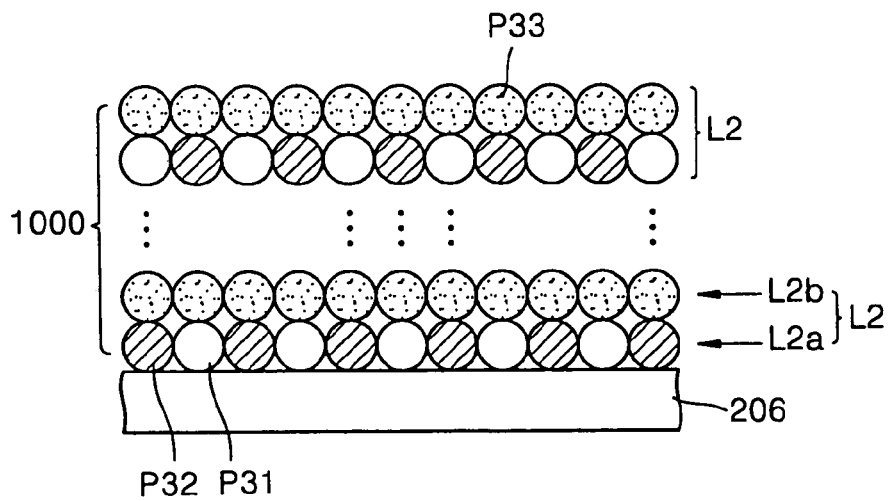

As shown in FIG. 20, a thin film 1000 is formed of unit material layers L2 which are composed of MALs L2a and atomic layers L2b. The MALs L2a are composed of first and second components P31 and P32 of which the thin film 1000 is formed, and the atomic layers L2b are composed of third components P33 of which the thin film 1000 is formed.

In the first through third embodiments, any one MAL (i.e., a single MAL L and the two MALs (L1a and L1b) of a double MAL L1, which constitute a unit material layer of a thin film, or the MAL L2a, which, when combined with an atomic layer L2b, would constitute a unit material layer of a thin film), is an atomic layer composed of at least two different components. Though not shown in FIGS. 18 through 20, MALs forming unit material layers of a thin film according to each of the first through third embodiments may be mosaic atomic layers composed of (precursors containing) three or four different components, depending on the number of components constituting the thin film.

As described above, in the method of forming a thin film including multi components according to the present invention, unit material layers constituting a thin film are formed of single MALs, or double MALs (each MAL of the double MAL containing a component which is different from a component in the other). The unit material layers may be composed of MALs and ALs (where the ALs contain only one of the components constituting the thin film). Thus, the advantages of a conventional method of forming ALs may be secured, and fewer steps are required in the process of forming ALs according to the present invention than in the conventional process of forming ALs. As a result, the time required for forming a thin film may be reduced. Also, since the thin film is formed and crystallized at a low temperature, an additional thermal process for the crystallization of the thin film after formation thereof is unnecessary. As a result, the yield of the method of forming a thin film of the present invention is remarkably higher than in the prior art.

Preferred embodiments of the present invention have been disclosed herein and, although specific terms are employed, they are used in a generic and descriptive sense only and not for the purpose of limitation. For example, if the number of components constituting a thin film is large, the thin film may be formed by a dual method by one of ordinary skill in the art. In other words, instead of forming and oxidizing MALs containing all the components constituting a thin film, MALs containing a portion of the components may be formed. For example, at least two MALs are formed and oxidized and then MALs containing the other components are formed and oxidized. Also, another embodiment, which is not described in the detailed description, may be realized by a combination of methods according to the embodiments of the present invention. For example, a first MAL may be formed on a substrate by a method of forming a thin film according to a first embodiment of the present invention. Any one of subsequent MALs may be formed by a method of forming a thin film according to a second embodiment of the present invention. Accordingly, it will be understood by those of ordinary skill in the art that various changes in form and details of the above-described embodiments of the present invention may be made without departing from the spirit and scope of the present invention as set forth in the following claims.

What is claimed is:

1. A method of forming a thin film, comprising:
providing a substrate;
forming a mosaic atomic layer (MAL) on the substrate by depositing a precursor of a first component and depositing a precursor of a second component on a surface of the substrate; and
chemically changing the MAL, wherein:
forming the MAL includes forming a first MAL and forming a second MAL on the first MAL,
forming the first MAL includes depositing the precursor of the first component and depositing the precursor of the second component on the surface of the substrate,
forming the second MAL includes depositing the precursor of the first component and depositing a precursor of a third component, and
chemically changing the MAL includes:
chemically changing the first MAL prior to forming the second MAL, and
chemically changing the second MAL.

2. A method of forming a thin film, comprising:
providing a substrate;
forming a mosaic atomic layer (MAL) on the substrate by depositing a precursor of a first component and depositing a precursor of a second component on a surface of the substrate; and
chemically changing the MAL, wherein:
forming the MAL includes forming a first MAL and forming a second MAL on the first MAL,
forming the first MAL includes depositing the precursor of the first component and depositing the precursor of the second component on the surface of the substrate,
forming the second MAL includes depositing the precursor of the first component and depositing the precursor of the second component, and
a ratio of the first component to the second component in the first MAL is different from a ratio of the first component to the second component in the second MAL.

3. A method of forming a thin film, comprising:
providing a substrate;
forming a pair of layers on the substrate, the pair of layers including a mosaic atomic layer (MAL), the MAL formed by depositing a precursor of a first component and depositing a precursor of a second component on a surface of the substrate; and
chemically changing the MAL, wherein:
the thin film includes one or more of an STO layer, a PZT layer, a BST layer, a YBCO layer, an SBTO layer, a HfSiON layer, a ZrSiO layer, a ZrHfO layer, a LaCoO layer, and a TiSiN layer chemically changing the MAL includes oxidizing the MAL, and oxidizing the MAL includes using a plasma process using one or more of H2O, O2, O3, and H2O2 as a source of oxygen or using ultraviolet-ozone, wherein the plasma is formed using radio frequency (RE) or microwave energy.

4. The method of claim 3, wherein chemically changing the MAL includes one or more of oxidizing the MAL, nitrifying the MAL, and boronizing the MAL.

5. The method of claim 3, wherein depositing the precursor of the first component and depositing the precursor of the second component are performed at the same time.

6. The method of claim 3, wherein:
depositing the precursor of the first component on the surface of the substrate is at a level less than that sufficient to form a continuous atomic layer on the surface, and
depositing the precursor of the second component is performed after depositing the precursor of the first component.

7. The method of claim 3, wherein:
chemically changing the MAL includes oxidizing the MAL, and
oxidizing the MAL includes using a plasma process using one or more of $H_2O$, $O_2$, $O_3$, and $H_2O_2$ as a source of oxygen or using ultraviolet-ozone.

8. The method of claim 3, wherein using the plasma process includes purging the source of oxygen using an inert gas, and applying direct current on the substrate so as to change the inert gas into a plasma state, the plasma being used to remove impurities adsorbed on the surface of the MAL.

9. The method of claim 7, wherein the plasma is formed using radio frequency (RF) or microwave energy.

10. The method of claim 3, wherein the thin film includes one or more of an oxide layer, a nitride layer, and a boride layer.

11. A method of forming a thin film, comprising:
providing a substrate;
forming a pair of layers on the substrate, the pair of layers consisting of a continuous atomic layer and a mosaic atomic layer (MAL), wherein the continuous atomic layer is a layer comprising one component and the MAL is a layer comprising at least two components; and
chemically changing the continuous atomic layer and the MAL, wherein:
the thin film includes one or more of an STO layer, a PZT layer, a BST layer, a YBCO layer, an SBTO layer, a HfSiON layer, a ZrSiO layer, a ZrHfO layer, a LaCoO layer, and a TiSiN layer.

12. The method of claim 11, wherein chemically changing the MAL includes one or more of oxidizing the MAL, nitrifying the MAL, and boronizing the MAL.

13. The method of claim 11, wherein forming the MAL includes depositing the at least two components at the same time.

14. The method of claim 11, wherein forming the MAL includes depositing the at least two components by a time-sharing method.

15. The method of claim 14, wherein depositing the at least two components by a time-sharing method includes supplying each of the at least two components of the MAL in an amount less than that sufficient to form a continuous atomic layer on the surface of the substrate.

16. The method of claim 11, wherein:
chemically changing the MAL includes oxidizing the MAL, and
oxidizing the MAL includes using a plasma process using one or more of $H_2O$, $O_2$, $O_3$, and $H_2O_2$ as a source of oxygen or using ultraviolet-ozone.

17. The method of claim 16, wherein using the plasma process includes purging the source of oxygen using an inert gas, and applying direct current on the substrate so as to change the inert gas into a plasma state, the plasma being used to remove impurities adsorbed on the surface of the MAL.

18. The method of claim 16, wherein the plasma is formed using radio frequency (RF) or microwave energy.

19. The method as claimed in claim 11, wherein the thin film includes one or more of an oxide layer, a nitride layer, and a boride layer.

* * * * *